United States Patent
Yang et al.

(10) Patent No.: US 12,136,622 B2
(45) Date of Patent: Nov. 5, 2024

(54) BIDIRECTIONAL ELECTROSTATIC DISCHARGE (ESD) PROTECTION DEVICE

(71) Applicant: AMAZING MICROELECTRONIC CORP., New Taipei (TW)

(72) Inventors: Tun-Chih Yang, New Taipei (TW); Zi-Ping Chen, New Taipei (TW); Kun-Hsien Lin, Hsinchu (TW)

(73) Assignee: Amazing Microelectronic Corp., New Taipei (TW)

( * ) Notice: Subject to any disclaimer, the term of this patent is extended or adjusted under 35 U.S.C. 154(b) by 226 days.

(21) Appl. No.: 17/646,735

(22) Filed: Jan. 3, 2022

(65) Prior Publication Data

US 2023/0215864 A1 Jul. 6, 2023

(51) Int. Cl.
*H01L 27/02* (2006.01)

(52) U.S. Cl.
CPC ...... *H01L 27/0292* (2013.01); *H01L 27/0255* (2013.01); *H01L 27/0259* (2013.01)

(58) Field of Classification Search
CPC ............. H01L 27/0292; H01L 27/0255; H01L 27/0259
USPC ....................................................... 257/173
See application file for complete search history.

(56) References Cited

U.S. PATENT DOCUMENTS

| | | | | |
|---|---|---|---|---|
| 5,212,618 A | * | 5/1993 | O'Neill | H01L 27/0248 361/91.5 |
| 7,361,942 B1 | | 4/2008 | Matteson et al. | |
| 9,287,700 B1 | * | 3/2016 | Hickman | H02H 9/044 |
| 2009/0079022 A1 | * | 3/2009 | Keena | H01L 29/8618 257/494 |
| 2012/0153347 A1 | * | 6/2012 | Vashchenko | H01L 27/0262 257/E27.032 |
| 2012/0241903 A1 | * | 9/2012 | Shen | H01L 27/0255 257/E29.166 |
| 2020/0035664 A1 | * | 1/2020 | Lin | H01L 27/0259 |

FOREIGN PATENT DOCUMENTS

| | | | |
|---|---|---|---|
| CN | 102376702 | * | 3/2012 |
| CN | 204029795 | * | 12/2014 |
| CN | 209544342 | * | 10/2019 |
| CN | 114743967 | * | 7/2022 |
| TW | I506908 B | | 11/2015 |

* cited by examiner

*Primary Examiner* — Sheng-Bai Zhu
(74) *Attorney, Agent, or Firm* — Rosenberg, Klein & Lee (57) ABSTRACT

A bidirectional electrostatic discharge protection device includes a first transient voltage suppressor chip, a second transient voltage suppressor chip, a first conductive wire, and a second conductive wire. The first transient voltage suppressor chip includes a first diode and a first bipolar junction transistor. The first diode and the first bipolar junction transistor are electrically connected to a first pin. The second transient voltage suppressor chip includes a second diode and a second bipolar junction transistor. The second diode and the second bipolar junction transistor are electrically connected to a second pin. The first conductive wire is electrically connected between the first diode and the second bipolar junction transistor. The second conductive wire is electrically connected between the second diode and the first bipolar junction transistor.

6 Claims, 5 Drawing Sheets

BIDIRECTIONAL ELECTROSTATIC DISCHARGE (ESD) PROTECTION DEVICE

BACKGROUND OF THE INVENTION

Field of the Invention

The present invention relates to an electrostatic discharge (ESD) protection device, particularly to a bidirectional electrostatic discharge (ESD) protection device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

Figure 1:
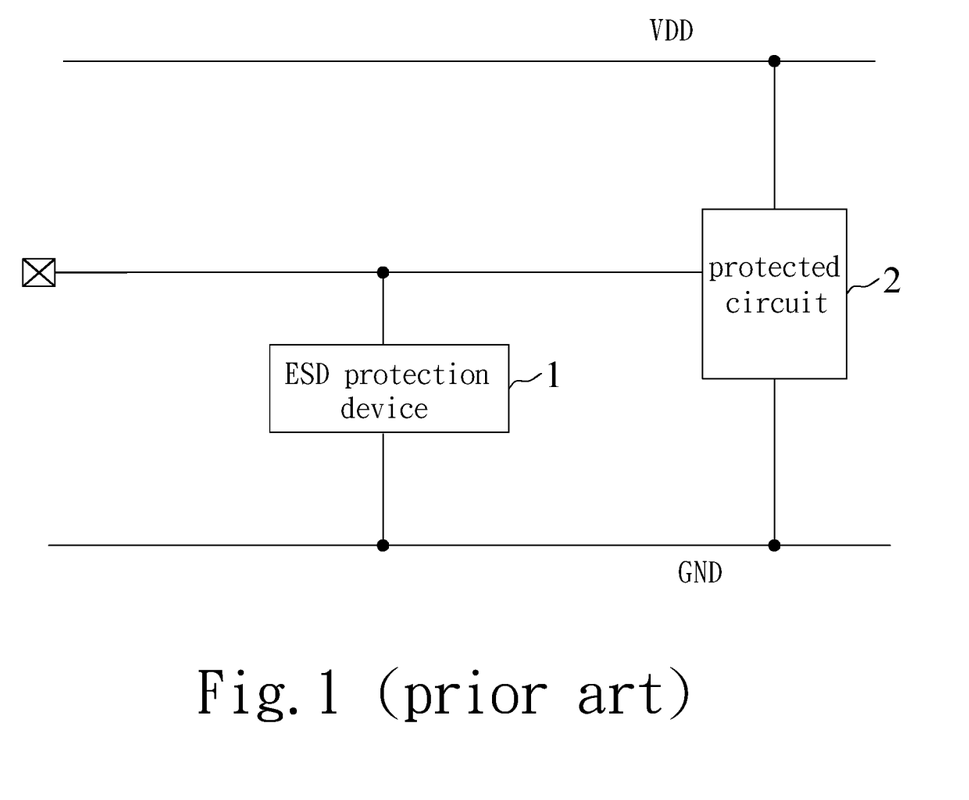
FIG. 1 is a schematic diagram illustrating an ESD protection device connected with a protected circuit on an IC chip in the conventional technology.

The working principle of ESD protection device is shown in FIG. 1. In FIG. 1, the ESD protection device 1 is connected in parallel with a protected circuit 2 on the IC chip. The ESD protection device 1 would be triggered immediately when the ESD event occurs. In that way, the ESD protection device 1 can provide a superiorly low resistance path for discharging the transient ESD current, so that the energy of the ESD transient current can be bypassed by the ESD protection device 1. For achieving the bidirectional ESD purpose, a bidirectional transient voltage suppressor includes two ESD paths. One of the ESD paths is a discharging path and another of the ESD paths is a reverse breakdown path. In a conventional technology, only one diode sustains a reverse voltage in the reverse breakdown path, such that the turned-on voltage applied to the discharging path easily exceeds the breakdown voltage of the diode. In the discharging path, three ESD elements are connected in series. Thus, the clamping voltage of the three ESD elements is higher. Besides, a bidirectional transient voltage is implemented in the U.S. Pat. No. 7,361,942 B1. However, a buried layer is used to connect diodes to increase the fabrication complexity.

To overcome the abovementioned problems, the present invention provides a bidirectional electrostatic discharge (ESD) protection device, so as to solve the afore-mentioned problems of the prior art.

SUMMARY OF THE INVENTION

The present invention provides a bidirectional electrostatic discharge (ESD) protection device, which has a lower clamping voltage in a discharging path, decreases the fabrication complexity, and improves the ESD level.

In an embodiment of the present invention, a bidirectional electrostatic discharge (ESD) protection device includes a first transient voltage suppressor chip, a second transient voltage suppressor chip, a first conductive wire, and a second conductive wire. The first transient voltage suppressor chip includes a first diode and a first PNP bipolar junction transistor. The anode of the first diode is electrically connected to a first pin. The collector of the first PNP bipolar junction transistor is electrically connected to the first pin, wherein the base of the first PNP bipolar junction transistor is floating. The second transient voltage suppressor chip includes a second diode and a second PNP bipolar junction transistor. The anode of the second diode is electrically connected to a second pin. The collector of the second PNP bipolar junction transistor is electrically connected to the second pin, wherein the base of the second PNP bipolar junction transistor is floating. The first conductive wire is electrically connected between the cathode of the first diode and the emitter of the second PNP bipolar junction transistor. The second conductive wire is electrically connected between the cathode of the second diode and the emitter of the first PNP bipolar junction transistor.

In an embodiment of the present invention, the parasitic capacitance of the first PNP bipolar junction transistor or the second PNP bipolar junction transistor is larger than that of the first diode or the second diode.

In an embodiment of the present invention, the bidirectional electrostatic discharge protection device further includes a first lead frame and a first conductive material. The first lead frame serves as the first pin. The first conductive material is formed on the first lead frame and electrically connected to the first lead frame, wherein the first transient voltage suppressor chip is formed on the first conductive material.

In an embodiment of the present invention, the first diode and the first PNP bipolar junction transistor are implemented with a first P-type semiconductor substrate, a first N-type semiconductor epitaxial layer, a first N-type heavily-doped area, and a first P-type heavily-doped area. The first P-type semiconductor substrate is formed on and electrically connected to the first conductive material. The first N-type semiconductor epitaxial layer is formed on the first P-type semiconductor substrate. The first N-type heavily-doped area and the first P-type heavily-doped area are formed in the first N-type semiconductor epitaxial layer. The first N-type heavily-doped area is electrically connected to the first conductive wire. The first P-type heavily-doped area is electrically connected to the second conductive wire. The first transient voltage suppressor chip further includes a first isolation structure. The first isolation structure is formed in the first N-type semiconductor epitaxial layer and formed between the first N-type heavily-doped area and the first P-type heavily-doped area. The first isolation structure touches the first P-type semiconductor substrate and separates the first N-type heavily-doped area from the first P-type heavily-doped area. The height of the first isolation structure is equal to or larger than the thickness of the first N-type semiconductor epitaxial layer.

In an embodiment of the present invention, the first isolation structure surrounds the first N-type heavily-doped area and the first P-type heavily-doped area.

In an embodiment of the present invention, the bidirectional electrostatic discharge protection device further includes a second lead frame and a second conductive material. The second lead frame serves as the second pin. The second conductive adhesive is formed on the second lead frame and electrically connected to the second lead frame. The second transient voltage suppressor chip is formed on the second conductive material.

In an embodiment of the present invention, the second diode and the second PNP bipolar junction transistor are implemented with a second P-type semiconductor substrate, a second N-type semiconductor epitaxial layer, a second N-type heavily-doped area, and a second P-type heavily-doped area. The second P-type semiconductor substrate is formed on and electrically connected to the second conductive material. The second N-type semiconductor epitaxial layer is formed on the second P-type semiconductor substrate. The second N-type heavily-doped area and the second P-type heavily-doped area are formed in the second N-type semiconductor epitaxial layer. The second N-type heavily-doped area is electrically connected to the second conductive wire. The second P-type heavily-doped area is electrically connected to the first conductive wire. The second transient voltage suppressor chip further includes a second isolation structure. The second isolation structure is formed in the second N-type semiconductor epitaxial layer and formed between the second N-type heavily-doped area and the second P-type heavily-doped area. The second isolation structure touches the second P-type semiconductor substrate and separates the second N-type heavily-doped area from the second P-type heavily-doped area. The height of the second isolation structure is equal to or larger than the thickness of the second N-type semiconductor epitaxial layer.

In an embodiment of the present invention, the second isolation structure surrounds the second N-type heavily-doped area and the second P-type heavily-doped area.

In an embodiment of the present invention, the bidirectional electrostatic discharge protection device further includes a packaging glue. The packaging glue encapsulates the first transient voltage suppressor chip, the second transient voltage suppressor chip, the first conductive wire, and the second conductive wire.

In an embodiment of the present invention, a bidirectional electrostatic discharge (ESD) protection device includes a first transient voltage suppressor chip, a second transient voltage suppressor chip, a first conductive wire, and a second conductive wire. The first transient voltage suppressor chip includes a first diode and a first NPN bipolar junction transistor. The cathode of the first diode is electrically connected to a first pin. The collector of the first NPN bipolar junction transistor is electrically connected to the first pin, wherein the base of the first NPN bipolar junction transistor is floating. The second transient voltage suppressor chip includes a second diode and a second NPN bipolar junction transistor. The cathode of the second diode is electrically connected to a second pin. The collector of the second NPN bipolar junction transistor is electrically connected to the second pin, wherein the base of the second NPN bipolar junction transistor is floating. The first conductive wire electrically connected between the anode of the first diode and the emitter of the second NPN bipolar junction transistor. The second conductive wire is electrically connected between the anode of the second diode and the emitter of the first NPN bipolar junction transistor.

In an embodiment of the present invention, the parasitic capacitance of the first PNP bipolar junction transistor or the second PNP bipolar junction transistor is larger than that of the first diode or the second diode.

In an embodiment of the present invention, the bidirectional electrostatic discharge protection device further includes a first lead frame and a first conductive material. The first lead frame serves as the first pin. The first conductive material is formed on the first lead frame and electrically connected to the first lead frame, wherein the first transient voltage suppressor chip is formed on the first conductive material.

In an embodiment of the present invention, the first diode and the first NPN bipolar junction transistor are implemented with a first N-type semiconductor substrate, a first P-type semiconductor epitaxial layer, a first P-type heavily-doped area, and a first N-type heavily-doped area. The first N-type semiconductor substrate is formed on and electrically connected to the first conductive material. The first P-type semiconductor epitaxial layer is formed on the first N-type semiconductor substrate. The first P-type heavily-doped area and the first N-type heavily-doped area are formed in the first P-type semiconductor epitaxial layer. The first P-type heavily-doped area is electrically connected to the first conductive wire. The first N-type heavily-doped area is electrically connected to the second conductive wire. The first transient voltage suppressor chip further includes a first isolation structure. The first isolation structure is formed in the first P-type semiconductor epitaxial layer and formed between the first P-type heavily-doped area and the first N-type heavily-doped area. The first isolation structure touches the first N-type semiconductor substrate and separates the first P-type heavily-doped area from the first N-type heavily-doped area. The height of the first isolation structure is equal to or larger than the thickness of the first P-type semiconductor epitaxial layer.

In an embodiment of the present invention, the first isolation structure surrounds the first P-type heavily-doped area and the first N-type heavily-doped area.

In an embodiment of the present invention, the bidirectional electrostatic discharge protection device further includes a second lead frame and a second conductive material. The second lead frame serves as the second pin. The second conductive material is formed on the second lead frame and electrically connected to the second lead frame. The second transient voltage suppressor chip is formed on the second conductive material.

In an embodiment of the present invention, the second diode and the second NPN bipolar junction transistor are implemented with a second N-type semiconductor substrate, a second P-type semiconductor epitaxial layer, a second P-type heavily-doped area, and a second N-type heavily-doped area. The second N-type semiconductor substrate is formed on and electrically connected to the second conductive material. The second P-type semiconductor epitaxial layer is formed on the second N-type semiconductor substrate. The second P-type heavily-doped area and the second N-type heavily-doped area are formed in the second P-type semiconductor epitaxial layer. The second P-type heavily-doped area is electrically connected to the second conductive wire. The second N-type heavily-doped area is electrically connected to the first conductive wire. The second transient voltage suppressor chip further includes a second isolation structure. The second isolation structure is formed in the second P-type semiconductor epitaxial layer and formed between the second P-type heavily-doped area and the second N-type heavily-doped area. The second isolation structure touches the second N-type semiconductor substrate and separates the second P-type heavily-doped area from the second N-type heavily-doped area. The height of the second isolation structure is equal to or larger than the thickness of the second P-type semiconductor epitaxial layer.

In an embodiment of the present invention, the second isolation structure surrounds the second P-type heavily-doped area and the second N-type heavily-doped area.

In an embodiment of the present invention, the bidirectional electrostatic discharge protection device further includes a packaging glue. The packaging glue encapsulates the first transient voltage suppressor chip, the second transient voltage suppressor chip, the first conductive wire, and the second conductive wire.

To sum up, the bidirectional ESD protection device uses two ESD elements to sustain a reverse voltage in a reverse breakdown path, such that the breakdown voltage of the ESD elements easily exceeds the total turned-on voltage applied to a discharging path. Besides, fewer ESD elements connected in series have a lower clamping voltage in the discharging path. The conductive wires replace a high-concentration and low-impedance path to decrease the fabrication complexity and form inductors to improve the ESD level.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, a bidirectional electrostatic discharge (ESD) protection device will be provided. The bidirectional ESD protection device uses two ESD elements to sustain a reverse voltage in a reverse breakdown path, such that the breakdown voltage of the ESD elements easily exceeds the total turned-on voltage applied to a discharging path. Besides, fewer ESD elements connected in series have a lower clamping voltage in the discharging path. The conductive wires replace a high-concentration and low-impedance path to decrease the fabrication complexity and form inductors to improve the ESD level.

Figure 2:
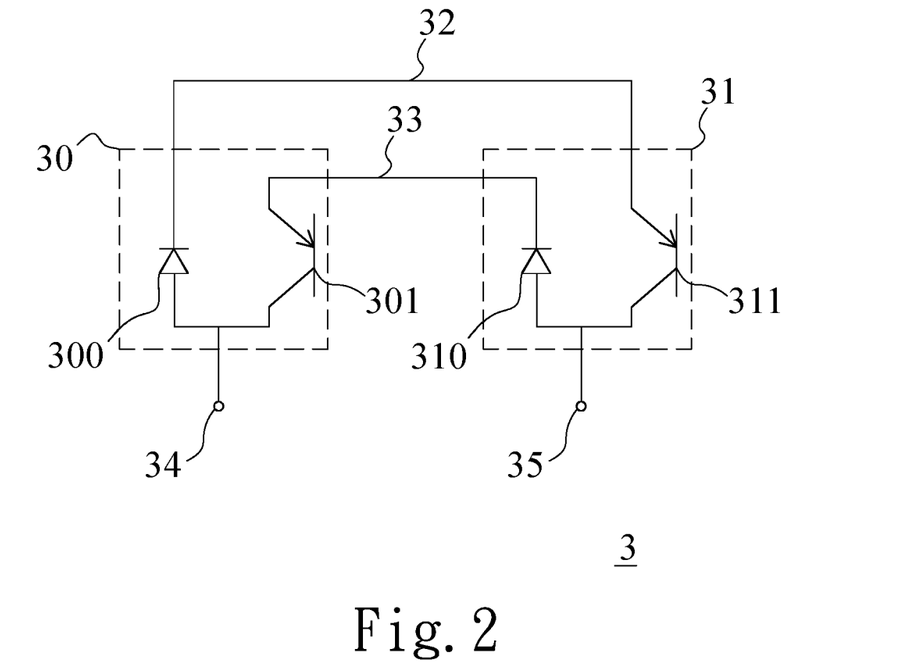
FIG. 2 is a schematic diagram illustrating a bidirectional electrostatic discharge (ESD) protection device according to a first embodiment of the present invention.

FIG. 2 is a schematic diagram illustrating a bidirectional electrostatic discharge (ESD) protection device according to a first embodiment of the present invention. Referring to FIG. 2, the bidirectional ESD protection device 3 includes a first transient voltage suppressor chip 30, a second transient voltage suppressor chip 31, a first conductive wire 32, and a second conductive wire 33. The first transient voltage suppressor chip 30 includes a first diode 300 and a first PNP bipolar junction transistor 301. The second transient voltage suppressor chip 31 includes a second diode 310 and a second PNP bipolar junction transistor 311. The anode of the first diode 300 is electrically connected to a first pin 34. The collector of the first PNP bipolar junction transistor 301 is electrically connected to the first pin 34. The base of the first PNP bipolar junction transistor 301 is floating. The anode of the second diode 310 is electrically connected to a second pin 35. The collector of the second PNP bipolar junction transistor 311 is electrically connected to the second pin 35, wherein the base of the second PNP bipolar junction transistor 311 is floating. The first conductive wire 32 is electrically connected between the cathode of the first diode 300 and the emitter of the second PNP bipolar junction transistor 311. The second conductive wire 33 is electrically connected between the cathode of the second diode 310 and the emitter of the first PNP bipolar junction transistor 301. The bidirectional ESD protection device 3 has two ESD paths, including those of a discharging path and a reverse breakdown path. One ESD path includes the first diode 300, the first conductive wire 32, and the second PNP bipolar junction transistor 311, and another ESD path includes the first PNP bipolar junction transistor 301, the second conductive wire 33, and the second diode 310. In order to reduce the entire capacitance of the bidirectional ESD protection device 3, the parasitic capacitance of the first PNP bipolar junction transistor 301 or the second PNP bipolar junction transistor 311 is larger than that of the first diode 300 or the second diode 310.

The operation of the bidirectional ESD protection device 3 of the first embodiment is introduced as follows. When the first pin 34 and the second pin 35 respectively receive a positive ESD voltage and a grounding voltage, an ESD current sequentially flows through the first diode 300, the first conductive wire 32, and the second PNP bipolar junction transistor 311. In such a case, the discharging path includes the first diode 300, the first conductive wire 32, and the second PNP bipolar junction transistor 311 and the reverse breakdown path includes the first PNP bipolar junction transistor 301, the second conductive wire 33, and the second diode 310. Besides, the turned-on voltage applied to the discharging path is less than the total breakdown voltage applied to the reverse breakdown path. That is to say, the total turned-on voltage of the first diode 300 and the second PNP bipolar junction transistor 311 is less than the total breakdown voltage of the first PNP bipolar junction transistor 301 and the second diode 310. Since the reverse breakdown path uses two ESD elements, the total breakdown voltage applied to the reverse breakdown path can be increased. Since the discharging path uses only two ESD elements, the clamping voltage of the discharging path is lower. In addition, the conductive wires 32 and 33 replace a conventional high-concentration and low-impedance path to decrease the fabrication complexity.

When the first pin 34 and the second pin 35 respectively receive a grounding voltage and a positive ESD voltage, an ESD current sequentially flows through the second diode 310, the second conductive wire 33, and the first PNP bipolar junction transistor 301. In such a case, the discharging path includes the first PNP bipolar junction transistor 301, the second conductive wire 33, and the second diode 310 and the reverse breakdown path includes the first diode 300, the first conductive wire 32, and the second PNP bipolar junction transistor 311. Besides, the turned-on voltage applied to the discharging path is less than the total breakdown voltage applied to the reverse breakdown path. That is to say, the total turned-on voltage of the first PNP bipolar junction transistor 301 and the second diode 310 is less than the total breakdown voltage of the first diode 300 and the second PNP bipolar junction transistor 311. Since the reverse breakdown path uses two ESD elements, the total breakdown voltage applied to the reverse breakdown path can be increased. Since the discharging path uses only two ESD elements, the clamping voltage of the discharging path is lower.

Figure 3:
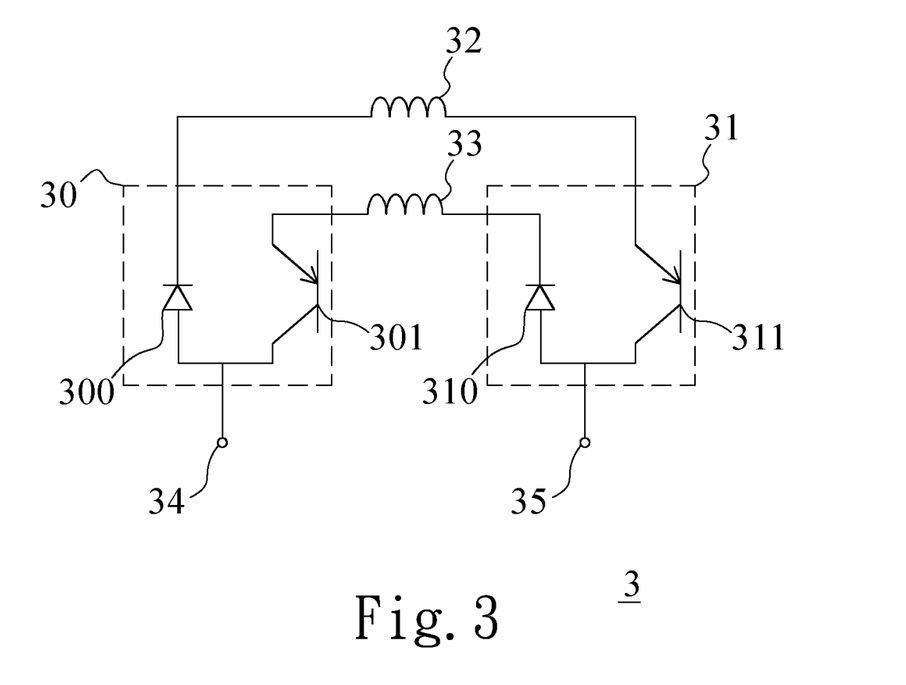
FIG. 3 is a schematic diagram illustrating a bidirectional ESD protection device according to a second embodiment of the present invention.

FIG. 3 is a schematic diagram illustrating a bidirectional ESD protection device according to a second embodiment of the present invention. Refer to FIG. When the high-frequency ESD voltage is applied to the first pin 34 and the second pin 35, the first conductive wire 32 and the second conductive wire 33 generate inductance effect to have high impedance and increase the rise time of the ESD voltage, thereby improving the ESD level of the bidirectional ESD protection device 3 and protecting the bidirectional ESD protection device 3 from damage.

Figure 4:
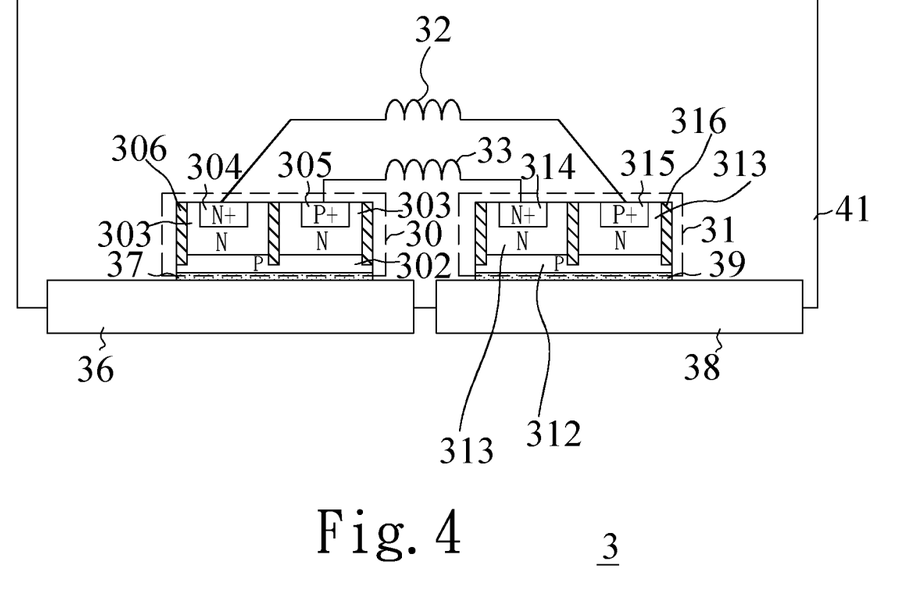
FIG. 4 is a cross-sectional view of a bidirectional ESD protection device according to a third embodiment of the present invention.

FIG. 4 is a cross-sectional view of a bidirectional ESD protection device according to a third embodiment of the present invention. Referring FIG. 4 and FIG. 3, the bidirectional ESD protection device 3 of the third embodiment further includes a first lead frame 36, a first conductive material 37, a second lead frame 38, and a second conductive material 39. For example, the first conductive material 37 and the second conductive material 39 may be conductive adhesives, eutectic materials, or the other suitable conductive materials. The first lead frame 36 serves as the first pin 34. The first conductive material 37 is formed on the first lead frame 36 and electrically connected to the first lead frame 36. The first transient voltage suppressor chip 30 is formed on the first conductive material 37. The second lead frame 38 serves as the second pin 35. The second conductive material 39 is formed on the second lead frame 38 and electrically connected to the second lead frame 38. The second transient voltage suppressor chip 31 is formed on the second conductive material 39.

The first diode 300 and the first PNP bipolar junction transistor 301 may be implemented with a first P-type semiconductor substrate 302, a first N-type semiconductor epitaxial layer 303, a first N-type heavily-doped area 304, and a first P-type heavily-doped area 305. The first diode 300 is implemented with the first P-type semiconductor substrate 302, the first N-type semiconductor epitaxial layer 303, and the first N-type heavily-doped area 304. The first PNP bipolar junction transistor 301 is implemented with the first P-type semiconductor substrate 302, the first N-type semiconductor epitaxial layer 303, and the first P-type heavily-doped area 305. The first P-type semiconductor substrate 302 is formed on and electrically connected to the first conductive material 37. The first N-type semiconductor epitaxial layer 303 is formed on the first P-type semiconductor substrate 302. The first N-type heavily-doped area 304 and the first P-type heavily-doped area 305 are formed in the first N-type semiconductor epitaxial layer 303. The first N-type heavily-doped area 304 is electrically connected to the first conductive wire 32. The first P-type heavily-doped area 305 is electrically connected to the second conductive wire 33. In addition, the first transient voltage suppressor chip 30 may further include a first isolation structure 306 made of an insulating material. The first isolation structure 306 is formed in the first N-type semiconductor epitaxial layer 303 and formed between the first N-type heavily-doped area 304 and the first P-type heavily-doped area 305. The first isolation structure 306 touches the first P-type semiconductor substrate 302 and separates the first N-type heavily-doped area 304 from the first P-type heavily-doped area 305. The height of the first isolation structure 306 is equal to or larger than the thickness of the first N-type semiconductor epitaxial layer 304. In order to reduce the parasitic capacitance of the first diode 300, the first isolation structure 306 may surround the first N-type heavily-doped area 304 and the first P-type heavily-doped area 305. On top of that, the first diode 300 and the first PNP bipolar junction transistor 301 are not connected to each other through metal, polysilicon, or a heavily-doped semiconductor layer.

The second diode 310 and the second PNP bipolar junction transistor 311 may be implemented with a second P-type semiconductor substrate 312, a second N-type semiconductor epitaxial layer 313, a second N-type heavily-doped area 314, and a second P-type heavily-doped area 315. The second diode 310 is implemented with the second P-type semiconductor substrate 312, the second N-type semiconductor epitaxial layer 313, and the second N-type heavily-doped area 314. The second PNP bipolar junction transistor 311 is implemented with the second P-type semiconductor substrate 312, the second N-type semiconductor epitaxial layer 313, and the second P-type heavily-doped area 315. The second P-type semiconductor substrate 312 is formed on and electrically connected to the second conductive material 39. The second N-type semiconductor epitaxial layer 313 is formed on the second P-type semiconductor substrate 312. The second N-type heavily-doped area 314 and the second P-type heavily-doped area 315 are formed in the second N-type semiconductor epitaxial layer 313. The second N-type heavily-doped area 314 is electrically connected to the second conductive wire 33. The second P-type heavily-doped area 315 is electrically connected to the first conductive wire 32. In addition, the second transient voltage suppressor chip 31 may further include a second isolation structure 316 made of an insulating material. The second isolation structure 316 is formed in the second N-type semiconductor epitaxial layer 313 and formed between the second N-type heavily-doped area 314 and the second P-type heavily-doped area 315. The second isolation structure 316 touches the second P-type semiconductor substrate 312 and separates the second N-type heavily-doped area 314 from the second P-type heavily-doped area 315. The height of the second isolation structure 316 is equal to or larger than the thickness of the second N-type semiconductor epitaxial layer 313. In order to reduce the parasitic capacitance of the second diode 310, the second isolation structure 316 may surround the second N-type heavily-doped area 314 and the second P-type heavily-doped area 315. On top of that, the second diode 310 and the second PNP bipolar junction transistor 311 are not connected to each other through metal, polysilicon, or a heavily-doped semiconductor layer.

In some embodiments of the present invention, the bidirectional electrostatic discharge protection device 3 may further include a packaging glue 41. The packaging glue 41 encapsulates the first transient voltage suppressor chip 30, the second transient voltage suppressor chip 31, the first conductive wire 32, and the second conductive wire 33 in cooperation with a mold.

Figure 5:
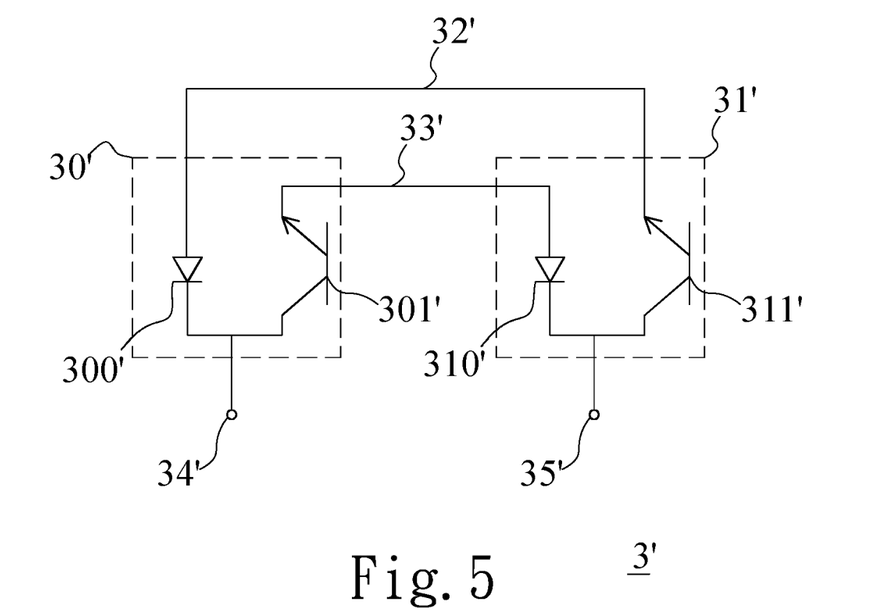
FIG. 5 is a schematic diagram illustrating a bidirectional ESD protection device according to a fourth embodiment of the present invention.

FIG. 5 is a schematic diagram illustrating a bidirectional ESD protection device according to a fourth embodiment of the present invention. Referring to FIG. 5, the bidirectional ESD protection device 3' includes a first transient voltage suppressor chip 30', a second transient voltage suppressor chip 31', a first conductive wire 32', and a second conductive wire 33'. The first transient voltage suppressor chip 30' includes a first diode 300' and a first NPN bipolar junction transistor 301'. The second transient voltage suppressor chip 31' includes a second diode 310' and a second NPN bipolar junction transistor 311'. The cathode of the first diode 300' is electrically connected to a first pin 34'. The collector of the first NPN bipolar junction transistor 301' is electrically connected to the first pin 34'. The base of the first NPN bipolar junction transistor 301' is floating. The cathode of the second diode 310' is electrically connected to a second pin 35'. The collector of the second NPN bipolar junction transistor 311' is electrically connected to the second pin 35', wherein the base of the second NPN bipolar junction transistor 311' is floating. The first conductive wire 32' is electrically connected between the anode of the first diode 300' and the emitter of the second NPN bipolar junction transistor 311'. The second conductive wire 33' is electrically connected between the anode of the second diode 310' and the emitter of the first NPN bipolar junction transistor 301'. The bidirectional ESD protection device 3' has two ESD paths, including those of a discharging path and a reverse breakdown path. One ESD path includes the first diode 300', the first conductive wire 32', and the second NPN bipolar junction transistor 311', and another ESD path includes the first NPN bipolar junction transistor 301', the second conductive wire 33', and the second diode 310'. In order to reduce the entire capacitance of the bidirectional ESD protection device 3', the parasitic capacitance of the first NPN bipolar junction transistor 301' or the second NPN bipolar junction transistor 311' is larger than that of the first diode 300' or the second diode 310'.

The operation of the bidirectional ESD protection device 3' of the fourth embodiment is introduced as follows. When the first pin 34' and the second pin 35' respectively receive a grounding voltage and a positive ESD voltage, an ESD current sequentially flows through the second NPN bipolar junction transistor 311', the first conductive wire 32', and the first diode 300'. In such a case, the discharging path includes the second NPN bipolar junction transistor 311', the first conductive wire 32', and the first diode 300' and the reverse breakdown path includes the first NPN bipolar junction transistor 301', the second conductive wire 33', and the second diode 310'. Besides, the turned-on voltage applied to the discharging path is less than the total breakdown voltage applied to the reverse breakdown path. That is to say, the total turned-on voltage of the first diode 300' and the second NPN bipolar junction transistor 311' is less than the total breakdown voltage of the first NPN bipolar junction transistor 301' and the second diode 310'. Since the reverse breakdown path uses two ESD elements, the total breakdown voltage applied to the reverse breakdown path can be increased. Since the discharging path uses only two ESD elements, the clamping voltage of the discharging path is lower. In addition, the conductive wires 32' and 33' replace a conventional high-concentration and low-impedance path to decrease the fabrication complexity.

When the first pin 34' and the second pin 35' respectively receive a positive ESD voltage and a grounding voltage, an ESD current sequentially flows through the first NPN bipolar junction transistor 301', the second conductive wire 33', and the second diode 310'. In such a case, the discharging path includes the first NPN bipolar junction transistor 301', the second conductive wire 33', and the second diode 310' and the reverse breakdown path includes the first diode 300', the first conductive wire 32', and the second NPN bipolar junction transistor 311'. Besides, the turned-on voltage applied to the discharging path is less than the total breakdown voltage applied to the reverse breakdown path. That is to say, the total turned-on voltage of the first NPN bipolar junction transistor 301' and the second diode 310' is less than the total breakdown voltage of the first diode 300' and the second NPN bipolar junction transistor 311'. Since the reverse breakdown path uses two ESD elements, the total breakdown voltage applied to the reverse breakdown path can be increased. Since the discharging path uses only two ESD elements, the clamping voltage of the discharging path is lower.

Figure 6:
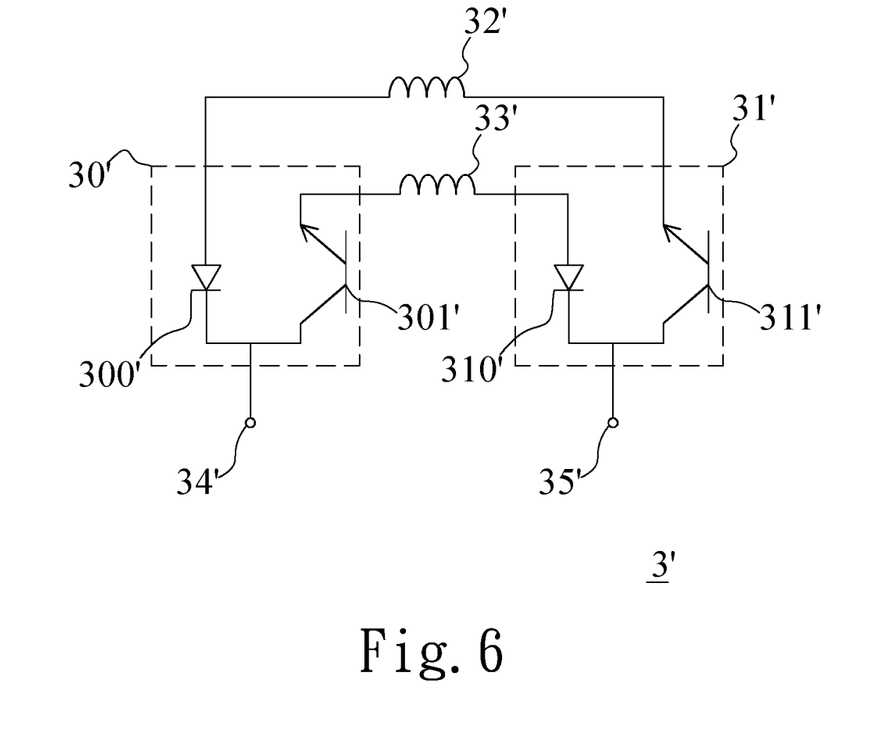
FIG. 6 is a schematic diagram illustrating a bidirectional ESD protection device according to a fifth embodiment of the present invention.

FIG. 6 is a schematic diagram illustrating a bidirectional ESD protection device according to a fifth embodiment of the present invention. Refer to FIG. 6. When the high-frequency ESD voltage is applied to the first pin 34' and the second pin 35', the first conductive wire 32' and the second conductive wire 33' generate inductance effect to have high impedance and increase the rise time of the ESD voltage, thereby improving the ESD level of the bidirectional ESD protection device 3' and protecting the bidirectional ESD protection device 3' from damage.

Figure 7:
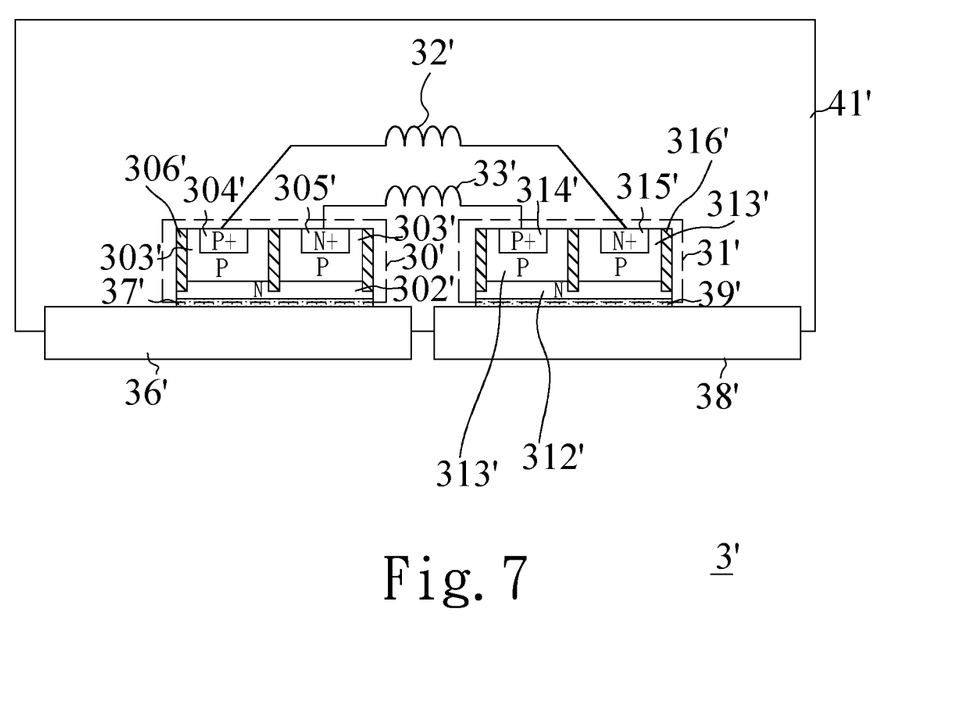
FIG. 7 is a cross-sectional view of a bidirectional ESD protection device according to a sixth embodiment of the present invention.

FIG. 7 is a cross-sectional view of a bidirectional ESD protection device according to a sixth embodiment of the present invention. Referring FIG. 7 and FIG. 6, the bidirectional ESD protection device 3' of the sixth embodiment further includes a first lead frame 36', a first conductive material 37', a second lead frame 38', and a second conductive material 39'. For example, the first conductive material 37' and the second conductive material 39' may be conductive adhesives, eutectic materials, or the other suitable conductive materials. The first lead frame 36' serves as the first pin 34'. The first conductive material 37' is formed on the first lead frame 36' and electrically connected to the first lead frame 36'. The first transient voltage suppressor chip 30' is formed on the first conductive material 37'. The second lead frame 38' serves as the second pin 35'. The second conductive material 39' is formed on the second lead frame 38' and electrically connected to the second lead frame 38'. The second transient voltage suppressor chip 31' is formed on the second conductive material 39'.

The first diode 300' and the first NPN bipolar junction transistor 301' may be implemented with a first N-type semiconductor substrate 302', a first P-type semiconductor epitaxial layer 303', a first P-type heavily-doped area 304', and a first N-type heavily-doped area 305'. The first diode 300' is implemented with the first N-type semiconductor substrate 302', the first P-type semiconductor epitaxial layer 303', and the first P-type heavily-doped area 304'. The first NPN bipolar junction transistor 301' is implemented with the first N-type semiconductor substrate 302', the first P-type semiconductor epitaxial layer 303', and the first N-type heavily-doped area 305'. The first N-type semiconductor substrate 302' is formed on and electrically connected to the first conductive material 37'. The first P-type semiconductor epitaxial layer 303' is formed on the first N-type semiconductor substrate 302'. The first P-type heavily-doped area 304' and the first N-type heavily-doped area 305' are formed in the first P-type semiconductor epitaxial layer 303'. The first P-type heavily-doped area 304' is electrically connected to the first conductive wire 32'. The first N-type heavily-doped area 305' is electrically connected to the second conductive wire 33'. In addition, the first transient voltage suppressor chip 30' may further include a first isolation structure 306' made of an insulating material. The first isolation structure 306' is formed in the first P-type semiconductor epitaxial layer 303' and formed between the first P-type heavily-doped area 304' and the first N-type heavily-doped area 305'. The first isolation structure 306' touches the first N-type semiconductor substrate 302' and separates the first P-type heavily-doped area 304' from the first N-type heavily-doped area 305'. The height of the first isolation structure 306' is equal to or larger than the thickness of the first P-type semiconductor epitaxial layer 304'. In order to reduce the parasitic capacitance of the first diode 300', the first isolation structure 306' may surround the first P-type heavily-doped area 304' and the first N-type heavily-doped area 305'. On top of that, the first diode 300' and the first NPN bipolar junction transistor 301' are not connected to each other through metal, polysilicon, or a heavily-doped semiconductor layer.

The second diode 310' and the second NPN bipolar junction transistor 311' may be implemented with a second N-type semiconductor substrate 312', a second P-type semiconductor epitaxial layer 313', a second P-type heavily-doped area 314', and a second N-type heavily-doped area 315'. The second diode 310' is implemented with the second N-type semiconductor substrate 312', the second P-type semiconductor epitaxial layer 313', and the second P-type heavily-doped area 314'. The second NPN bipolar junction transistor 311' is implemented with the second N-type semiconductor substrate 312', the second P-type semiconductor epitaxial layer 313', and the second N-type heavily-doped area 315'. The second N-type semiconductor substrate 312' is formed on and electrically connected to the second conductive material 39'. The second P-type semiconductor epitaxial layer 313' is formed on the second N-type semiconductor substrate 312'. The second P-type heavily-doped area 314' and the second N-type heavily-doped area 315' are formed in the second P-type semiconductor epitaxial layer 313'. The second P-type heavily-doped area 314' is electrically connected to the second conductive wire 33'. The second N-type heavily-doped area 315' is electrically connected to the first conductive wire 32'. In addition, the second transient voltage suppressor chip 31' may further include a second isolation structure 316' made of an insulating material. The second isolation structure 316' is formed in the second P-type semiconductor epitaxial layer 313' and formed between the second P-type heavily-doped area 314' and the second N-type heavily-doped area 315'. The second isolation structure 316' touches the second N-type semiconductor substrate 312' and separates the second P-type heavily-doped area 314' from the second N-type heavily-doped area 315'. The height of the second isolation structure 316' is equal to or larger than the thickness of the second P-type semiconductor epitaxial layer 313'. In order to reduce the parasitic capacitance of the second diode 310', the second isolation structure 316' may surround the second P-type heavily-doped area 314' and the second N-type heavily-doped area 315'. On top of that, the second diode 310' and the second NPN bipolar junction transistor 311' are not connected to each other through metal, polysilicon, or a heavily-doped semiconductor layer.

In some embodiments of the present invention, the bidirectional electrostatic discharge protection device 3' may further include a packaging glue 41'. The packaging glue 41' encapsulates the first transient voltage suppressor chip 30', the second transient voltage suppressor chip 31', the first conductive wire 32', and the second conductive wire 33' in cooperation with a mold.

In conclusion, the bidirectional ESD protection device uses two ESD elements to sustain a reverse voltage in a reverse breakdown path, such that the breakdown voltage of the ESD elements easily exceeds the total turned-on voltage applied to a discharging path. Besides, fewer ESD elements connected in series have a lower clamping voltage in the discharging path. The conductive wires replace a high-concentration and low-impedance path to decrease the fabrication complexity and form inductors to improve the ESD level.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:
1. A bidirectional electrostatic discharge (ESD) protection device comprising:
    a first transient voltage suppressor chip comprising:
        a first diode with an anode thereof electrically connected to a first pin; and a first PNP bipolar junction transistor with a collector thereof electrically connected to the first pin;
a second transient voltage suppressor chip comprising:
a second diode with an anode thereof electrically connected to a second pin; and
a second PNP bipolar junction transistor with a collector thereof electrically connected to the second pin, wherein a parasitic capacitance of the first PNP bipolar junction transistor or the second PNP bipolar junction transistor is larger than that of the first diode or the second diode;
a first conductive wire electrically connected between a cathode of the first diode and an emitter of the second PNP bipolar junction transistor;
a second conductive wire electrically connected between a cathode of the second diode and an emitter of the first PNP bipolar junction transistor;
a first lead frame serving as the first pin;
a first conductive material formed on the first lead frame and electrically connected to the first lead frame, wherein the first transient voltage suppressor chip is formed on the first conductive material;
a second lead frame serving as the second pin; and
a second conductive material formed on the second lead frame and electrically connected to the second lead frame, wherein the second transient voltage suppressor chip is formed on the second conductive material;
wherein the first diode and the first PNP bipolar junction transistor are implemented with a first P-type semiconductor substrate, a first N-type semiconductor epitaxial layer, a first N-type heavily-doped area, and a first P-type heavily-doped area, the first P-type semiconductor substrate is formed on and electrically connected to the first conductive material, the first N-type semiconductor epitaxial layer, formed on the first P-type semiconductor substrate, directly interfaces the first P-type semiconductor substrate, the first N-type heavily-doped area and the first P-type heavily-doped area are formed in the first N-type semiconductor epitaxial layer, the first N-type heavily-doped area is electrically connected to the first conductive wire, the first P-type heavily-doped area is electrically connected to the second conductive wire, the first transient voltage suppressor chip further comprises a first isolation structure, the first isolation structure is formed in the first N-type semiconductor epitaxial layer and formed between the first N-type heavily-doped area and the first P-type heavily-doped area, the first isolation structure touches the first P-type semiconductor substrate and separates the first N-type heavily-doped area from the first P-type heavily-doped area, and a height of the first isolation structure is equal to or larger than a thickness of the first N-type semiconductor epitaxial layer;
the first isolation structure surrounds the first N-type heavily-doped area and the first P-type heavily-doped area;
wherein the second diode and the second PNP bipolar junction transistor are implemented with a second P-type semiconductor substrate, a second N-type semiconductor epitaxial layer, a second N-type heavily-doped area, and a second P-type heavily-doped area, the second P-type semiconductor substrate is formed on and electrically connected to the second conductive material, the second N-type semiconductor epitaxial layer, formed on the second P-type semiconductor substrate, directly interfaces the second P-type semiconductor substrate, the second N-type heavily-doped area and the second P-type heavily-doped area are formed in the second N-type semiconductor epitaxial layer, the second N-type heavily-doped area is electrically connected to the second conductive wire, the second P-type heavily-doped area is electrically connected to the first conductive wire, the second transient voltage suppressor chip further comprises a second isolation structure, the second isolation structure is formed in the second N-type semiconductor epitaxial layer and formed between the second N-type heavily-doped area and the second P-type heavily-doped area, the second isolation structure touches the second P-type semiconductor substrate and separates the second N-type heavily-doped area from the second P-type heavily-doped area, and a height of the second isolation structure is equal to or larger than a thickness of the second N-type semiconductor epitaxial layer;
wherein the second isolation structure surrounds the second N-type heavily-doped area and the second P-type heavily-doped area.

2. The bidirectional electrostatic discharge protection device according to claim 1, wherein bases of the first PNP bipolar junction transistor and the second PNP bipolar junction transistor are floating.

3. The bidirectional electrostatic discharge protection device according to claim 1, further comprising a packaging glue encapsulating the first transient voltage suppressor chip, the second transient voltage suppressor chip, the first conductive wire, and the second conductive wire.

4. A bidirectional electrostatic discharge (ESD) protection device comprising:
a first transient voltage suppressor chip comprising:
a first diode with a cathode thereof electrically connected to a first pin; and
a first NPN bipolar junction transistor with a collector thereof electrically connected to the first pin;
a second transient voltage suppressor chip comprising:
a second diode with a cathode thereof electrically connected to a second pin; and
a second NPN bipolar junction transistor with a collector thereof electrically connected to the second pin, wherein a parasitic capacitance of the first NPN bipolar junction transistor or the second NPN bipolar junction transistor is larger than that of the first diode or the second diode;
a first conductive wire electrically connected between an anode of the first diode and an emitter of the second NPN bipolar junction transistor;
a second conductive wire electrically connected between an anode of the second diode and an emitter of the first NPN bipolar junction transistor;
a first lead frame serving as the first pin;
a first conductive material formed on the first lead frame and electrically connected to the first lead frame, wherein the first transient voltage suppressor chip is formed on the first conductive material;
a second lead frame serving as the second pin; and
a second conductive material formed on the second lead frame and electrically connected to the second lead frame, wherein the second transient voltage suppressor chip is formed on the second conductive material;
wherein the first diode and the first NPN bipolar junction transistor are implemented with a first N-type semiconductor substrate, a first P-type semiconductor epitaxial layer, a first P-type heavily-doped area, and a first N-type heavily-doped area, the first N-type semiconductor substrate is formed on and electrically connected to the first conductive material, the first P-type semiconductor epitaxial layer, formed on the first N-type semiconductor substrate, directly interfaces the first N-type semiconductor substrate, the first P-type heavily-doped area and the first N-type heavily-doped area are formed in the first P-type semiconductor epitaxial layer, the first P-type heavily-doped area is electrically connected to the first conductive wire, the first N-type heavily-doped area is electrically connected to the second conductive wire, the first transient voltage suppressor chip further comprises a first isolation structure, the first isolation structure is formed in the first P-type semiconductor epitaxial layer and formed between the first P-type heavily-doped area and the first N-type heavily-doped area, the first isolation structure touches the first N-type semiconductor substrate and separates the first P-type heavily-doped area from the first N-type heavily-doped area, and a height of the first isolation structure is equal to or larger than a thickness of the first P-type semiconductor epitaxial layer;

wherein the first isolation structure surrounds the first P-type heavily-doped area and the first N-type heavily-doped area;

wherein the second diode and the second NPN bipolar junction transistor are implemented with a second N-type semiconductor substrate, a second P-type semiconductor epitaxial layer, a second P-type heavily-doped area, and a second N-type heavily-doped area, the second N-type semiconductor substrate is formed on and electrically connected to the second conductive material, the second P-type semiconductor epitaxial layer, formed on the second N-type semiconductor substrate, directly interfaces the second N-type semiconductor substrate, the second P-type heavily-doped area and the second N-type heavily-doped area are formed in the second P-type semiconductor epitaxial layer, the second P-type heavily-doped area is electrically connected to the second conductive wire, the second N-type heavily-doped area is electrically connected to the first conductive wire, the second transient voltage suppressor chip further comprises a second isolation structure, the second isolation structure is formed in the second P-type semiconductor epitaxial layer and formed between the second P-type heavily-doped area and the second N-type heavily-doped area, the second isolation structure touches the second N-type semiconductor substrate and separates the second P-type heavily-doped area from the second N-type heavily-doped area, and a height of the second isolation structure is equal to or larger than a thickness of the second P-type semiconductor epitaxial layer;

wherein the second isolation structure surrounds the second P-type heavily-doped area and the second N-type heavily-doped area.

5. The bidirectional electrostatic discharge protection device according to claim 4, wherein bases of the first NPN bipolar junction transistor and the second NPN bipolar junction transistor are floating.

6. The bidirectional electrostatic discharge protection device according to claim 4, further comprising a packaging glue encapsulating the first transient voltage suppressor chip, the second transient voltage suppressor chip, the first conductive wire, and the second conductive wire.

* * * * *